United States Patent [19]
Jost et al.

[11] Patent Number: 5,629,528
[45] Date of Patent: May 13, 1997

[54] CHARGED PARTICLE BEAM SYSTEM HAVING BEAM-DEFINING SLIT FORMED BY ROTATING CYCLINDERS

[75] Inventors: Jonathan A. Jost, Kensington, N.H.; Leo V. Klos, Newburyport; Michael E. Mack, Manchester, both of Mass.

[73] Assignee: Varian Associates, Inc., Palo Alto, Calif.

[21] Appl. No.: 585,626

[22] Filed: Jan. 16, 1996

[51] Int. Cl.⁶ .................................................. H01J 37/09
[52] U.S. Cl. .................................. 250/492.21; 250/505.1
[58] Field of Search ........................ 250/492.21, 505.1

[56] References Cited

U.S. PATENT DOCUMENTS

| | | | |
|---|---|---|---|
| 4,017,403 | 4/1977 | Freeman | 250/492 A |
| 4,118,630 | 10/1978 | McKenna et al. | 250/492 A |
| 4,283,631 | 8/1981 | Turner | 250/492 B |
| 4,578,589 | 3/1986 | Aitken | 250/492.2 |
| 4,980,562 | 12/1990 | Berrian et al. | 250/492.2 |
| 5,130,552 | 7/1992 | Bright et al. | 250/492.21 |

FOREIGN PATENT DOCUMENTS 57-50755  3/1982  Japan ................................ 250/505.1

*Primary Examiner*—Jack I. Berman
*Attorney, Agent, or Firm*—Wolf, Greenfield & Sacks

[57] ABSTRACT

A slit assembly for use in a charged particle beam system wherein a charged particle beam is directed along a beam path. The slit assembly may be a mass resolving slit assembly for an ion implanter. The slit assembly includes first and second cylinders spaced apart from each other. Opposing surfaces of the first and second cylinders adjacent to the beam path define a slit for passing the charged particle beam. The first and second cylinders have first and second central axes, respectively. The slit assembly further includes a drive system for rotating the first cylinder about the first central axis and for rotating the second cylinder about the second central axis. The slit assembly provides low contamination and a long operating life. The slit assembly may include a system for adjusting the width of the slit. The slit assembly may further include a cooling system for controlling the temperatures of the first and second cylinders.

36 Claims, 9 Drawing Sheets

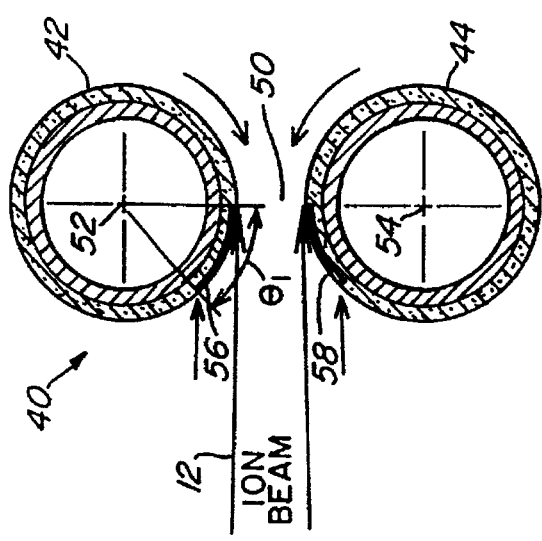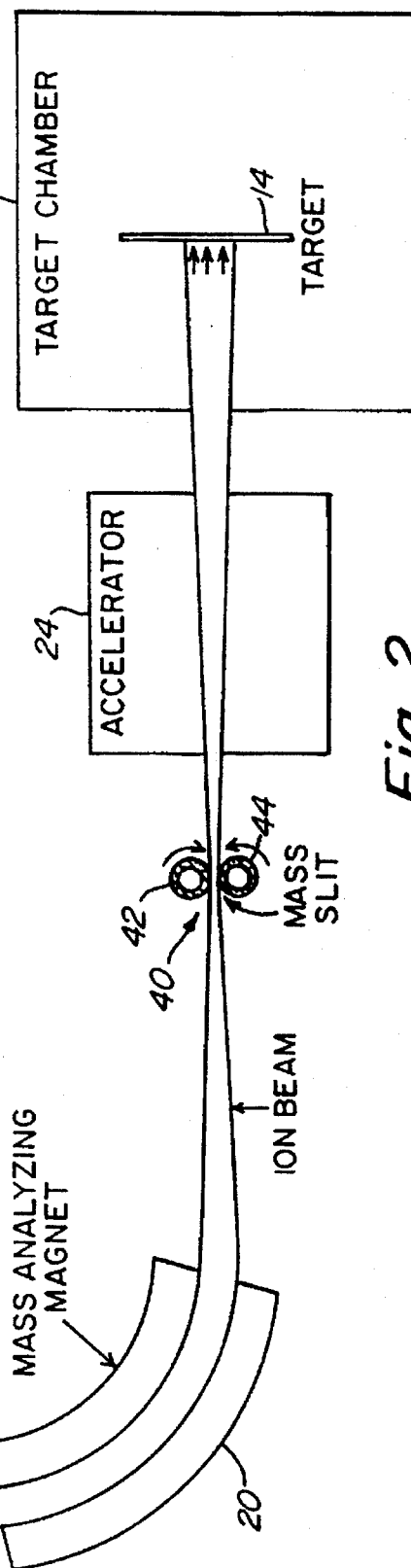

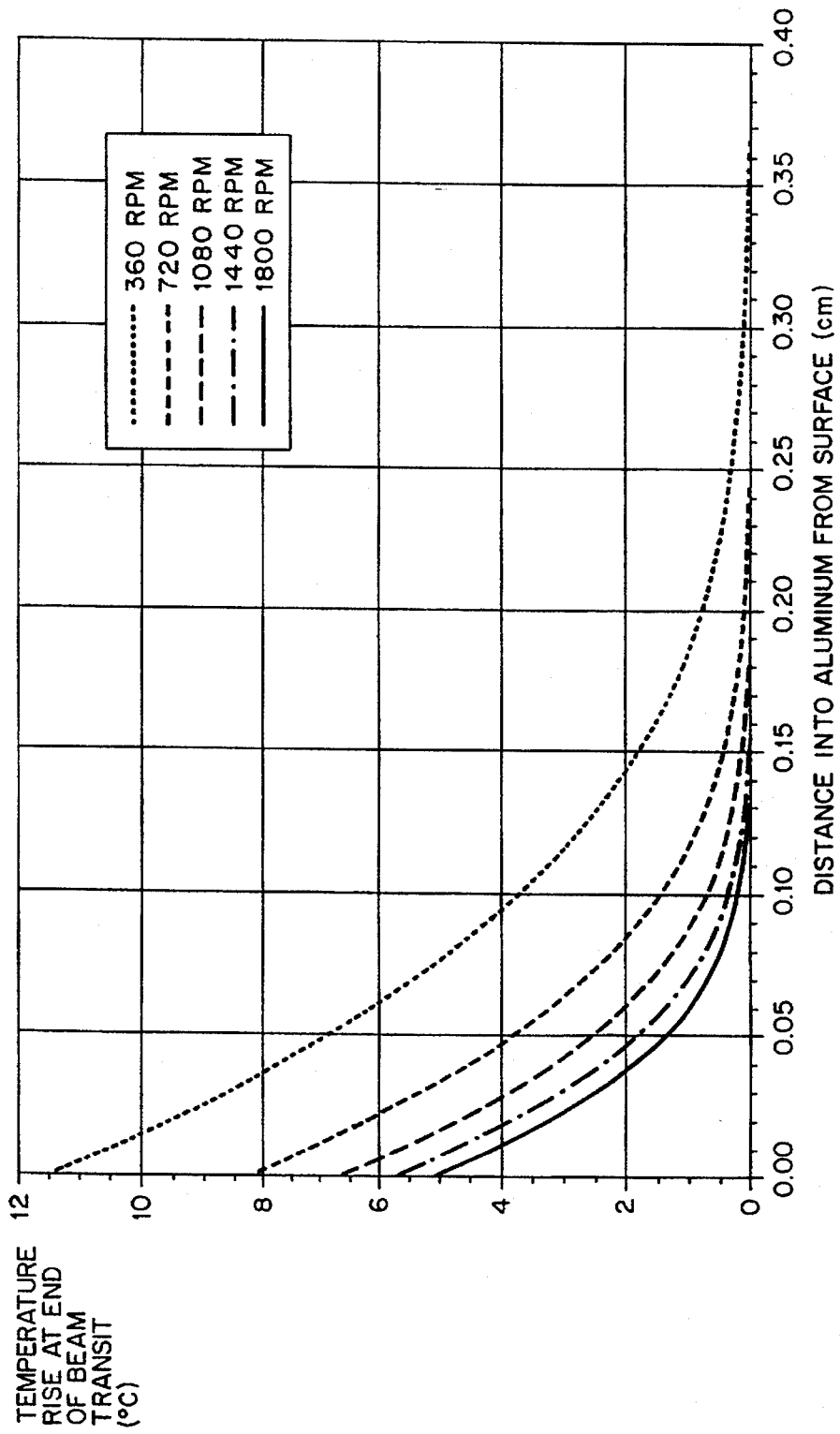

CHARGED PARTICLE BEAM SYSTEM HAVING BEAM-DEFINING SLIT FORMED BY ROTATING CYCLINDERS

FIELD OF THE INVENTION

This invention relates to charged particle beam systems such as ion implanters and, more particularly, to a beam-defining slit assembly which utilizes rotating cylinders for defining a slit.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded in the crystalline lattice of the semiconductor material to form a region of desired conductivity.

The ion source typically generates two or more ion species having different masses. For example, boron produces ion species with atomic masses of 10 and 11. Ion implanters commonly include a mass analyzing magnet and a mass resolving slit for selecting a desired ion species from the ion species generated in the ion source. The analyzing magnet produces a magnetic field which bends the path of each ion species according to its mass. The analyzing magnet also focuses the ion beam in the plane of the mass resolving slit. The magnetic fields are adjusted such that only the desired ion species passes through the resolving slit. The remaining ion species are intercepted by the elements that define the resolving slit and are separated from the ion beam. Ion implanters having mass analyzing magnets and resolving slits are disclosed, for example, in U.S. Pat. Nos. 4,980,562 issued Dec. 25, 1990 to Berrian et al; 4,283,631 issued Aug. 11, 1981 to Turner; 4,118,630 issued Oct. 3, 1978 to McKenna et al and 4,578,589 issued Mar. 25, 1986 to Aitken. An ion beam separator for use in ion implantation is disclosed in U.S. Pat. No. 4,017,413 issued Apr. 12, 1977 to Freeman. The slit disclosed by Freeman is rotatable about an axis parallel with the beam height for adjusting the width of the beam permitted to pass through the slit.

A trend in ion implanters is toward higher beam currents in order to reduce implantation time and thereby increase throughput. When high beam currents are utilized, the current and power density at the mass resolving slit is very high. For beam currents of on the order of 30 milliamps, the power density at the resolving slit may be on the order to 500 to 700 watts per square centimeter ($W/cm^2$). In a well-tuned beam, only about 20% of the beam power passes through the slit. If the mass resolving slit is cooled by radiation alone, the incident power is sufficient to raise the mass slit temperature to over 2000° C. Even higher temperatures result during the tuning process when the full power density is incident on one side of the slit or the other. Conduction cooling may be used to lower the temperature somewhat. However, both conduction cooling and radiation cooling result in extreme temperature gradients, extending from the edge of the slit into the slit-defining element.

Because of the high operating temperatures, mass resolving slits are usually fabricated of graphite, although refractory metals such as tungsten, molybdenum and tantalum have occasionally been used. All of these materials have a pronounced grain structure. When used as a beam-defining aperture for high current ion implantation, the high thermal stress across the grain boundaries results in fracture and the ejection of a microscopic particle of material. In the case of graphite, amorphous structures such as vitreous carbon reduce the erosion rate, but erosion is still dominated by spalling rather than sputtering, presumably because the vitreous graphites are still inhomogeneous.

The particle ejected from the mass resolving slit experiences a force due to the impinging ions in the ion beam, which impart their momentum to the particle. It can be shown that the force of ion impact on the particle dwarfs the gravitation force for small particles. For reasonable initial velocities, most of the small particles stay in the beam because of the enormous acceleration experienced by ion impact. Larger particles leave the beam more readily because their initial momentum carries them out. Nonetheless, considerable wafer contamination is experienced due to slit erosion in an ion implanter. Contamination of semiconductor wafers being implanted is highly undesirable. Furthermore, the contamination standard has become increasingly strict as the feature sizes of semiconductor devices are reduced.

Another disadvantage of erosion of the mass resolving slit is that the operating life of the slit itself is limited. For high beam currents, the life of the resolving slit may be very short. The resulting downtime for replacement of the resolving slit is costly to the semiconductor manufacturer. Prior efforts at reducing erosion of the mass resolving slit have focused on obtaining better grades of graphite which have high density and therefore have lower thermal gradients and reduced erosion. These efforts have not provided satisfactory results.

SUMMARY OF THE INVENTION

According to a first aspect of the present invention, a charged particle beam apparatus is provided. The apparatus comprises a charged particle beam source for directing a charged particle along a beam path toward a target and a slit assembly disposed along the beam path. The slit assembly comprises first and second cylinders positioned on opposite sides of the beam path and spaced apart from each other. Opposing surfaces of the first and second cylinders adjacent to the beam path define a slit for passing at least a portion of the charged particle beam. The slit assembly further comprises a drive system for rotating the first cylinder about its central axis and for rotating the second cylinder about its central axis.

Preferably, the opposing surfaces of the first and second cylinders adjacent to the beam path are rotated in opposite directions toward the charged particle beam source. Particles eroded from the cylinders thereby have an initial velocity toward the charged particle beam source and have a low probability of contaminating the target.

The drive system preferably comprises a motor and a coupler connected between the motor and the first and second cylinders. The coupler may comprise a first gear connected to and driven by the motor, a second gear connected to the first cylinder and driven by the first gear, and a third gear connected to the second cylinder and driven by the second gear. The first and second cylinders rotate in opposite directions.

The slit assembly preferably further includes a cooling system for controlling the temperatures of the first and second cylinders. The cooling system may include means for circulating a cooling fluid through internal passages in the first and second cylinders. In a preferred embodiment, the first and second cylinders each comprise a shell enclosing an interior volume and a cylindrical baffle positioned in the interior volume and concentric with the shell. The shell and the cylindrical baffle define a cylindrical passage between them. The cooling fluid is circulated through the cylindrical passage of each of the cylinders.

The first and second cylinders may each comprise a cylindrical shell and a cylindrical graphite sleeve over the shell. The graphite sleeve is in thermal contact with the shell to provide low thermal conductivity between the graphite sleeve and the shell in vacuum.

The drive system preferably further includes means for adjusting the width of the slit, measured perpendicular to the beam path. The first and second cylinders may be rotated with respect to an adjustment axis. The means for rotating the first and second cylinders may comprise a plate for supporting the first and second cylinders for rotation about their central axes, a drive motor and a coupler connected between the drive motor and the plate. The plate is mounted for rotation about the adjustment axis when the drive motor is energized.

According to another aspect of the invention, an ion implanter comprises an ion source for directing an ion beam along a beam path toward a workpiece, a mass analyzing magnet disposed along the beam path for deflecting ions in the ion beam according to mass, a slit assembly disposed along the beam path downstream of the mass analyzing magnet for passing a selected ion species in the ion beam, an accelerator disposed along the beam path for accelerating the ions in the ion beam to desired energies, means for distributing the ion beam over the workpiece, and a vacuum system for maintaining a high vacuum along the beam path between the ion source and the workpiece. The slit assembly comprises first and second cylinders positioned on opposite sides of the beam path and spaced apart from each other. Opposing surfaces of the first and second cylinders adjacent to the beam path define a slit for passing the selected ion species. The first and second cylinders have first and second central axes, respectively. The slit assembly further comprises a mechanism for rotating the first cylinder about the first central axis and for rotating the second cylinder about the second central axis.

According to a further aspect of the invention, a method for spatial filtering of a charged particle beam directed along a beam path is provided. The method comprises the steps of positioning first and second cylinders on opposite sides of the beam path. The first and second cylinders are spaced apart from each other such that opposing surfaces of the first and second cylinders adjacent to the beam define a slit for passing at least a portion of the charged particle beam. The first and second cylinders have first and second central axes, respectively. The method further comprises rotating the first cylinder about the first central axis and rotating the second cylinder about the second central axis.

According to still another aspect of the invention, a slit assembly for use in a charged particle beam system is provided. The slit assembly comprises first and second cylinders spaced apart from each other and a drive system for rotating the first and second cylinders about their respective central axes. Opposing surfaces of the first and second cylinders adjacent to the beam path define a slit for passing the charged particle beam.

According to yet another aspect of the invention, charged particle beam apparatus comprises a charged particle beam source for directing a charged particle beam along a beam path toward a target and a beam-defining assembly disposed along the beam path. The beam-defining assembly comprises a beam-defining element positioned along the beam path such that a first portion of the charged particle beam is incident on the beam-defining element and a second portion of the charged particle beam passes the beam-defining element along the beam path toward the target. The beam-defining assembly further comprises a drive system for rotating the beam-defining element about its central axis. Different surface regions of the beam-defining element are exposed to the charged particle beam as the beam-defining element rotates.

BRIEF DESCRIPTION OF THE DRAWINGS

For a better understanding of the present invention, reference is made to the accompanying drawings, which are incorporated herein by reference and in which:

FIG. 2 is a simplified schematic block diagram of an ion implanter incorporating a mass resolving slit assembly in accordance with the present invention;

FIG. 2A is an enlarged schematic view of the mass resolving slit assembly shown in FIG. 2;

FIG. 10 is a graph of rotating slit single pass temperature rise as a function of distance into aluminum from surface for different rotation speeds.

DETAILED DESCRIPTION

Figure 1A:
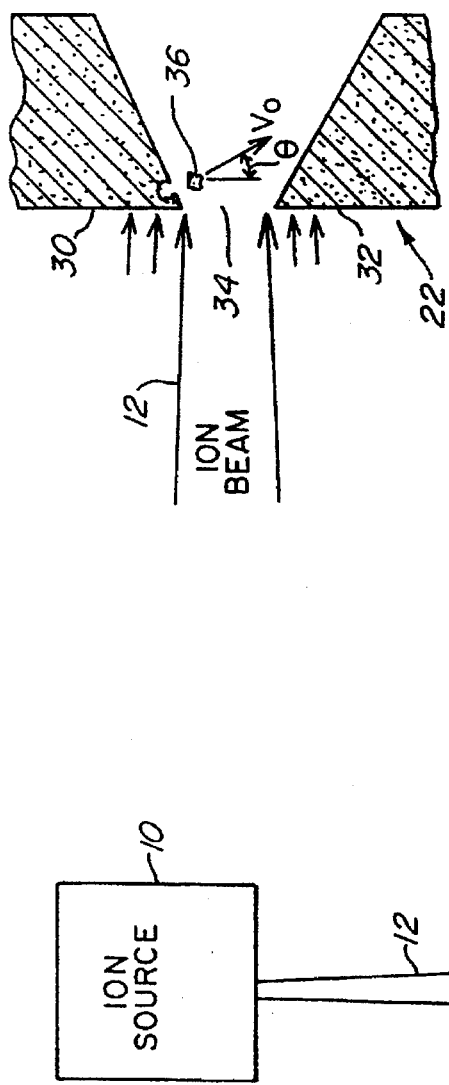
FIG. 1A is an enlarged view of the mass resolving slit shown in FIG. 1.
Figure 1:
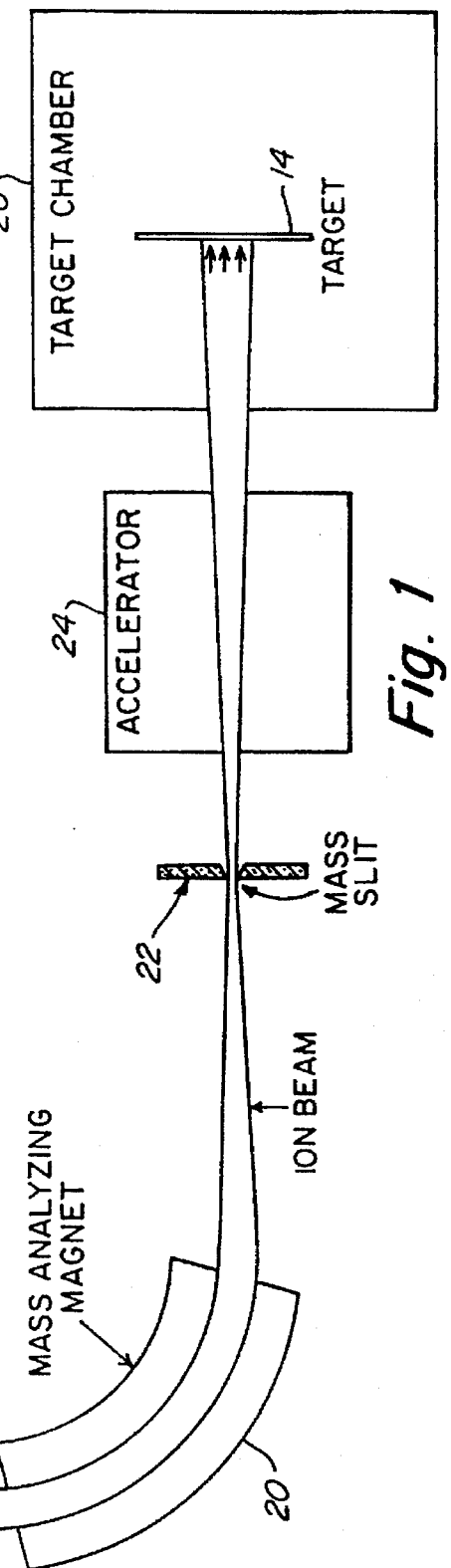
FIG. 1 is a simplified schematic block diagram of an ion implanter in accordance with the prior art.

A schematic block diagram of a prior art ion implanter is shown in FIG. 1. An ion source 10 directs an ion beam 12 along a beam path toward a target 14, typically a semiconductor wafer. The ion beam 12 is deflected and focused by a mass analyzing magnet 20. The ion beam is focused in the plane of a mass resolving slit assembly 22. The ion beam 20 is accelerated to a desired energy by an accelerator 24 and is incident on the target 14 located within a target chamber 26. It will be understood that the entire region between the ion source 10 and the target 14 is maintained at high vacuum during ion implantation. The ion beam 12 may be distributed over the surface of target 14 by mechanically scanning target 14 with respect to the beam, by scanning the ion beam with respect to the target or by a combination of these techniques. The target chamber 26 may include a system for automatically loading semiconductor wafers into one or more target positions for implantation and for removing the wafers from the target chamber after ion implantation. The wafers may, for example, be mounted on a rotating disk during ion implantation. The structure and operation of ion implanters is well known to those skilled in the art.

An enlarged view of the mass resolving slit assembly 22 is shown in FIG. 1A. Walls 30 and 32 define a mass resolving slit 34. As known in the art, different ion species in ion beam 12 are deflected through different angles by the mass analyzing magnet 20. A desired ion species passes through the mass resolving slit 34 to target 14. Undesired ion species are intercepted by walls 30 and 32 of the mass slit assembly. The walls 30 and 32 are typically fabricated of high density graphite. As shown in FIG. 1A, the portions of ion beam 12 incident on walls 30 and 32 cause heating of walls 30 and 32 and may cause particles 36 to be eroded from the walls 30 and 32. The particles 36 are accelerated by the impact of ions in ion beam 12 toward target 14, thereby causing contamination of target 14. In addition, the erosion of particles 36 from the mass resolving slit 22 causes degradation of the slit and reduces its lifetime. As indicated above, these problems can be severe in the case of a high current ion beam 12. A variety of different ion implanter configurations are known in the art. However, virtually all ion implanters utilize a mass analyzing magnet and a mass resolving slit for selecting a desired ion species for implantation.

A schematic block diagram of an ion implanter incorporating the present invention is shown in FIG. 2. Like elements in FIGS. 1 and 2 have the same reference numerals. In FIG. 2, a mass resolving slit assembly 40 comprises a first cylinder 42 and a second cylinder 44 disposed on opposite sides of the beam path. An enlarged schematic view of the mass resolving slit assembly 40 is shown in FIG. 2A. A mass resolving slit 50 is defined by the space between cylinders 42 and 44. The cylinder 42 has a central axis 52, and the cylinder 44 has a central axis 54. During operation, cylinder 42 is rotated about central axis 52, and cylinder 44 is rotated about central axis 54. The ion beam 12 includes a portion that passes through slit 50 and portions that are incident on band 56 of cylinder 42 and/or band 58 of cylinder 44. More specifically, ion beam 12 may impinge, in whole or in part, on one or both of cylinders 42 and 44, or the entire ion beam 12 may pass through slit 50. The dimensions of bands 56 and 58 may vary, depending on the characteristics of ion beam 12. Furthermore, the bands 56 and 58 may have different sizes. Since the ion beam 12 is incident on different surface areas of cylinders 42 and 44 as cylinders 42 and 44 rotate, the energy of the ion beam is distributed over the cylindrical surfaces of cylinders 42 and 44. As a result, cylinders 42 and 44 are heated more or less uniformly around their circumferences, and the temperature rise is considerably less than that which occurs in prior art stationary mass resolving slits. By controlling the temperature rise of the elements which define the mass resolving slit, temperature gradients through the depth are reduced and, therefore, erosion of those elements is significantly reduced.

A further feature of the invention is illustrated with reference to FIG. 2A. In a preferred embodiment, the cylinders 42 and 44 are rotated in opposite directions such that opposing surfaces of cylinders 42 and 44 adjacent to slit 50 rotate toward the ion beam 12, i.e. toward the ion source. In the example of FIGS. 2 and 2A, this is achieved when cylinder 42 rotates in a clockwise direction and cylinder 44 rotates in a counterclockwise direction. When the cylinders are counter-rotating, with rotation of the surfaces adjacent to the slit rotating into the beam, particles ejected from the cylinders initially move upstream with respect to the ion beam. Due to the rotation of the cylinders, the upstream velocity of the ejected particles may be significant. For example, for a cylinder speed of 1800 rpm and a cylinder diameter of 2.75 inches, the tangential velocity is 660 centimeters per second. Since the ejected particles are unlikely to be traveling directly into the beam but rather travel at some angle to the beam, there is a chance that the particles will escape from the beam. Thus, the counter-rotating configuration is preferred. However, the advantages of reduced temperatures, reduced temperature gradients, reduced erosion and reduced contamination are obtained with the rotating cylinders 42 and 44, regardless of the directions in which the cylinders rotate.

Figure 3:
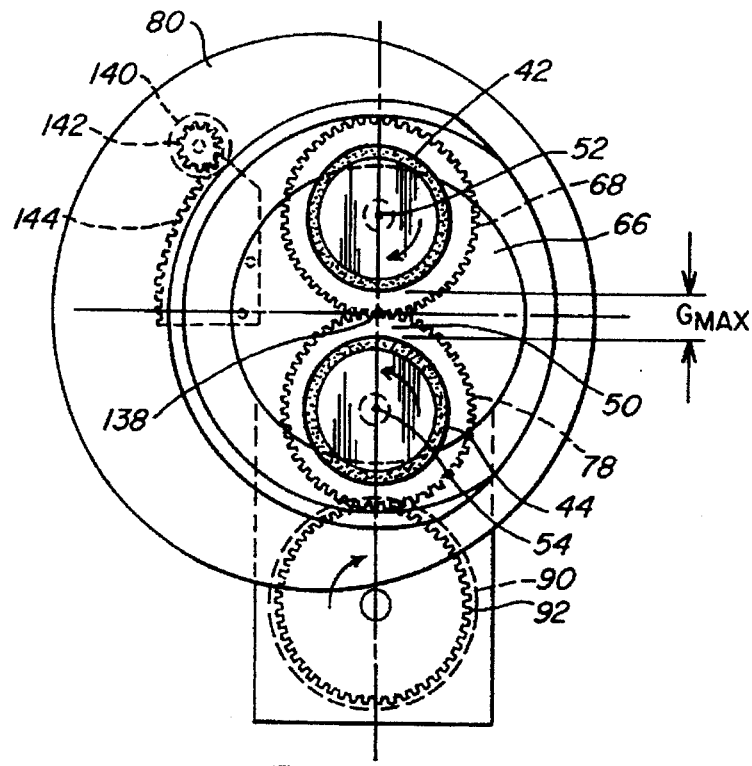
FIG. 3 is a schematic top plan view of a mass resolving slit assembly in accordance with the present invention, shown with the slit adjusted to its maximum width.
Figure 4:
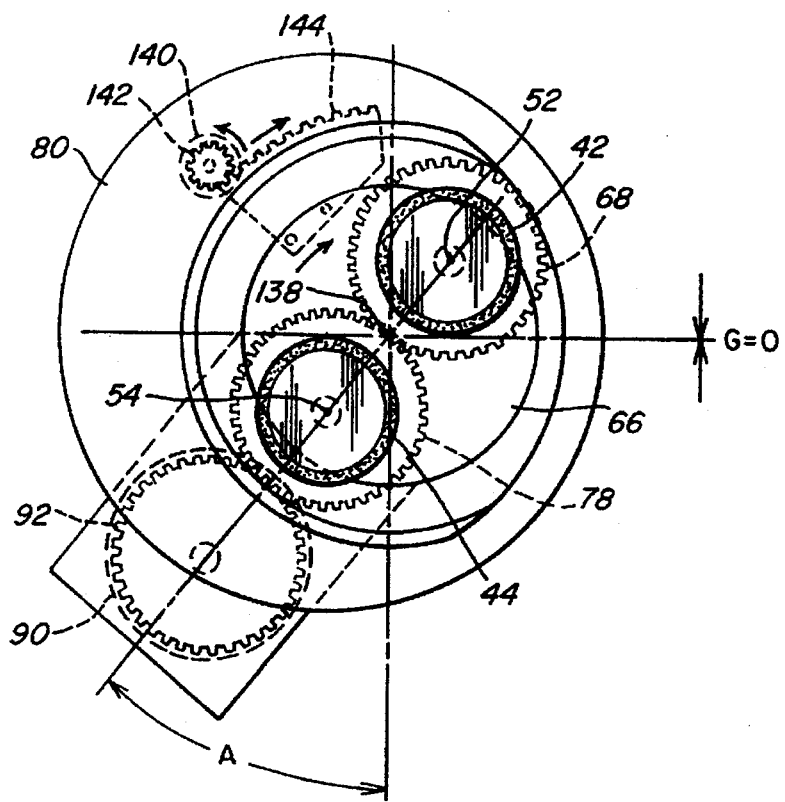
FIG. 4 is a schematic top plan view of a mass resolving slit assembly in accordance with the present invention, shown with the slit fully closed.
Figure 5:
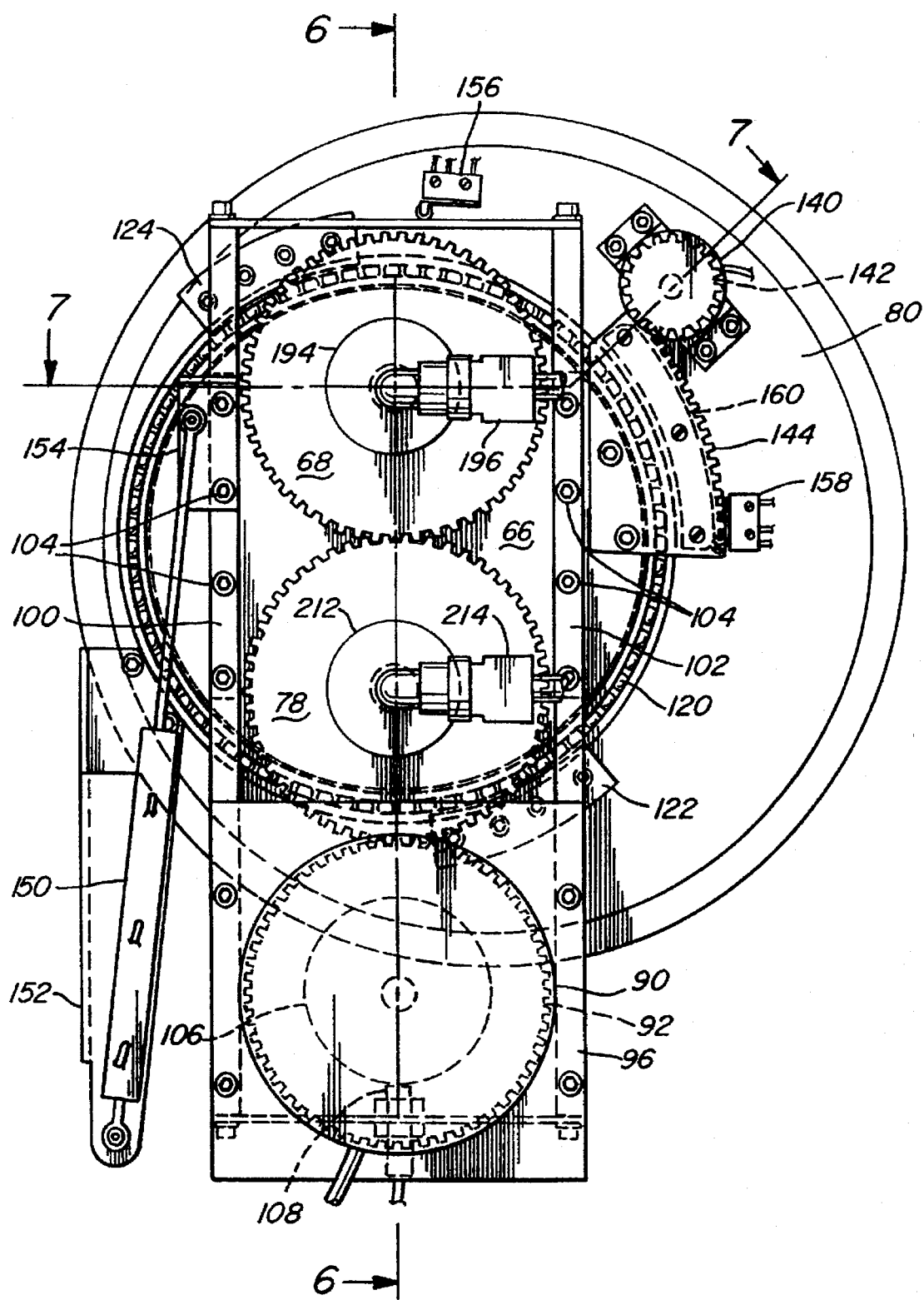
FIG. 5 is a bottom plan view of a mass resolving slit assembly in accordance with the present invention.

An example of a mass resolving slit assembly in accordance with the present invention is illustrated in FIGS. 3–8. The principal components of the mass resolving slit assembly include cylinders 42 and 44 and a drive system for rotating cylinders 42 and 44 about central axes 52 and 54, respectively. The drive system preferably includes a mechanism for adjusting the width of slit 50, measured in a direction perpendicular to ion beam 12, from a maximum value $G_{max}$, as shown in FIG. 3, to a minimum value of $G=0$, as shown in FIG. 4. The slit assembly preferably further includes a cooling system for actively cooling cylinders 42 and 44 during operation.

The drive system for rotating cylinders 42 and 44 about axes 52 and 54, respectively, is best illustrated in FIGS. 3–6. The cylinders 42 and 44 are located in a high vacuum region of the ion implanter, while the major components of the drive system are located outside the vacuum region. A vacuum chamber wall 60 shown in FIG. 6 separates the high vacuum region, where the cylinders 42 and 44 are located, from the external environment at atmospheric pressure. Cylinder 42 is connected by a shaft 62 and a ferrofluidic seal 64 through a plate 66 to a gear 68. Similarly, cylinder 44 is connected by a shaft 72 and a ferrofluidic seal 74 through plate 66 to a gear 78. The plate 66 forms a part of the wall of the vacuum chamber and, as described below, rotates during adjustment of the width of slit 50. Ferrofluidic seals 64 and 74 are conventional components which transmit rotational motion while maintaining a high vacuum seal. The plate 66 is rotatably mounted in a plate 80 as described below. The plate 80, in turn, is mounted in a stationary position with respect to vacuum chamber wall 60 and is sealed vacuum tight.

A motor 90 has a gear 92 attached to its drive shaft. Gear 92 engages gear 78, and gear 78 engages gear 68. When the motor 90 is energized, gear 92 drives gear 78, and gear 78 drives gear 68, causing cylinders 42 and 44 to rotate. When gears 68 and 78 have equal diameters and equal numbers of teeth, cylinders 42 and 44 rotate at equal speeds and in opposite directions.

The motor 90 is mounted to a plate 96, which is secured to rails 100 and 102. The rails 100 and 102 are affixed to plate 66 by bolts 104. By mounting the motor 90 to plate 66, the drive system for cylinders 42 and 44, including gears 68, 78 and 92, and motor 90, rotates with plate 66 as the width of the slit 50 is adjusted.

A disk 106 is attached to the shaft of motor 90 and rotates when the motor 90 is energized. A sensor 108 is mounted adjacent to disk 106 and senses rotation of disk 106. The sensor 108 provides an electrical signal representative of the speed of rotation of the motor 90. Optical or magnetic sensors, for example, may be utilized.

In operation, the motor 90 is energized continuously during ion implantation, causing the cylinders 42 and 44 to rotate. In a preferred embodiment, the cylinders 42 and 44 rotate at 1700 rpm. However, other rotation speeds may be utilized within the scope of the present invention. Furthermore, as noted above, the cylinders preferably rotate in opposite directions, with opposing surfaces 42a and 44a (FIG. 6) adjacent to slit 50 rotating toward the ion beam (toward the ion source). Rotation at equal speeds and in opposite directions is provided by the drive system shown in FIGS. 3–7 and described above. While rotation of surfaces 42a and 44a toward the ion source provides advantageous operation, different rotation schemes can be utilized within the scope of the present invention. The principal advantage of the invention is achieved by providing rotating cylinders wherein the energy of the ion beam is distributed over the surfaces of the cylinders, thereby reducing the temperatures and consequent erosion of the cylinders which define slit 50.

As indicated above, the drive system preferably includes a mechanism for adjusting the width of slit 50. Adjustment of the slit width is desirable, because the ion implanter is likely to be used under a variety of different conditions, including different ion species, different ion energies and the like. The width of the slit 50 is adjusted as follows. The plate 66 is circular in shape and is mounted for rotation with respect to plate 80. A bearing 120 is secured between plate 80 and plate 66 by bearing retainers 122 and 124, thus permitting plate 66 to rotate relative to plate 80. In addition, elastomer seals 126 and 128 are mounted between plates 66 and 80. Preferably, the elastomer seals 126 and 128 are spaced apart, and an annular space 130 between seals 126 and 128 is differentially vacuum pumped. This configuration minimizes leakage from the exterior environment into the vacuum chamber.

The plate 66 is rotated with respect to plate 80 about an adjustment axis 138 by a slit adjustment motor 140. A gear 142 is mounted on the drive shaft of slit adjustment motor 140, and a sector gear 144 is mounted to plate 66. The gear 142 engages sector gear 144 such that when motor 140 is energized, plate 66 is caused to rotate about adjustment axis 138. The rotation of plate 66 causes cylinders 42 and 44 to be rotated with respect to the beam path such that the width of slit 50, measured perpendicular to the beam path, is adjusted. In a preferred embodiment, the plate 66 rotates in a range of about 45°, causing the slit 50 to vary from fully closed (G=0) to fully open ($G_{max}$). In the preferred embodiment, the maximum width $G_{max}$ of slit 50 is about one inch. As described above, the drive system for rotating cylinders 42 and 44 about their central axes 52 and 54 is mounted to plate 66 and rotates with it, as shown in FIGS. 3 and 4. Thus, the cylinders 42 and 44 rotate with respect to their central axes independent of the width to which the slit 50 is adjusted.

The position of plate 66 with respect to plate 80 is determined by a sensor 150, typically a linear potentiometer. One end of sensor 150 is connected to a bracket 152 mounted on plate 80, and the other end of sensor 150 is attached to a bracket 154 mounted on rail 100. The sensor 150 outputs a signal that is representative of the angular position of plate 66 with respect to plate 80 and is therefore representative of the width of slit 50. Limit switches 156 and 158 are mounted on plate 80 at positions corresponding to the limits of rotation of plate 66. A cam 160 is mounted to sector gear 144. The cam 160 activates switches 156 and 158 at the limits of travel. Upon activation of either of switches 156 and 158, the motor 140 is deenergized.

Figure 8:
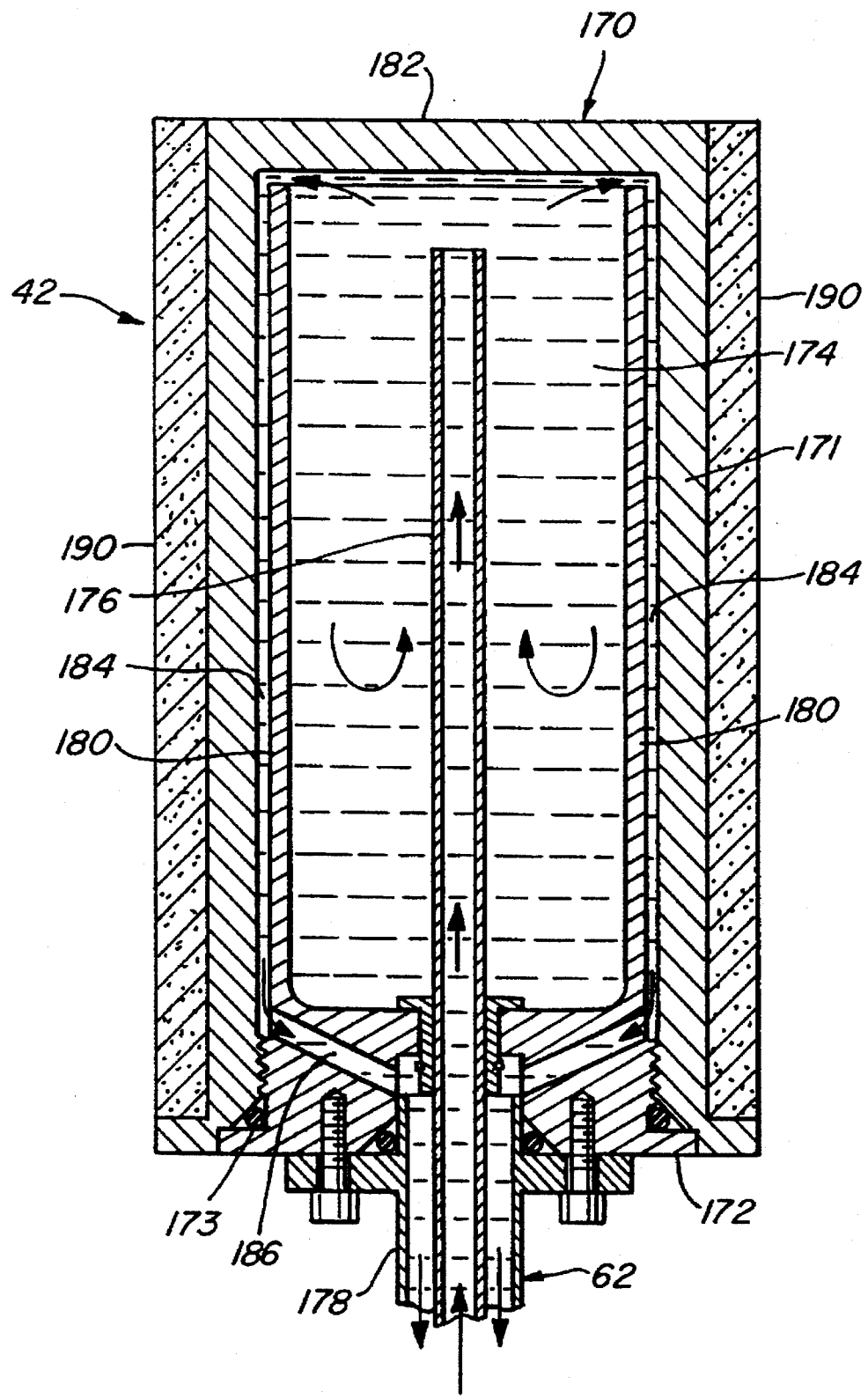
FIG. 8 is an enlarged cross-sectional side view of a cylinder, taken along the line 8—8 of FIG. 6.

A preferred construction of cylinder 42 is shown in FIG. 8. The cylinder 44 may have an identical construction. A shell 170 is preferably fabricated of a thermally conductive metal, such as aluminum. The shell 170 includes a cylindrical sidewall 171 and is closed at its upper end by a top wall 182. A cap 172 is threaded into the lower end of shell 170 and is sealed to shell 170 by an elastomer ring 173. The shell 170 defines an interior volume 174 for circulation of a cooling fluid, as discussed below. The shaft 62 is attached to cap 172 and has a coaxial construction, including an inner tube 176 and a coaxial outer tube 178. The inner tube 176 extends to the upper portion of interior volume 174. The cylinder 42 further includes a cylindrical baffle 180 mounted within interior volume 174. The cylindrical baffle 180 is concentric with cylindrical sidewall 171 and extends to a point slightly below top wall 182 of shell 170. A cylindrical passage 184 is defined between cylindrical sidewall 171 and cylindrical baffle 180. The cylindrical passage 184 is connected, via a passage 186 between cap 172 and a lower portion of baffle 180, to the outer tube 178 of shaft 62.

A further important component of cylinder 42 is a cylindrical outer sleeve 190. The outer sleeve 190 is preferably fabricated of high density graphite and is in thermal contact with the outer surface of cylindrical sidewall 171. Another suitable material for outer sleeve 190 is silicon flame sprayed aluminum. During operation, the energy of the ion beam incident on outer sleeve 190 is conducted through cylindrical sidewall 171 to a cooling fluid circulating through cylindrical passage 184. In general, the outer sleeve 190 is required to exhibit low sputtering at the operating conditions of the system. In a preferred embodiment, the graphite outer sleeve 190 is press fit onto shell 170 in order to achieve high thermal conductivity between these elements in vacuum.

Figure 6:
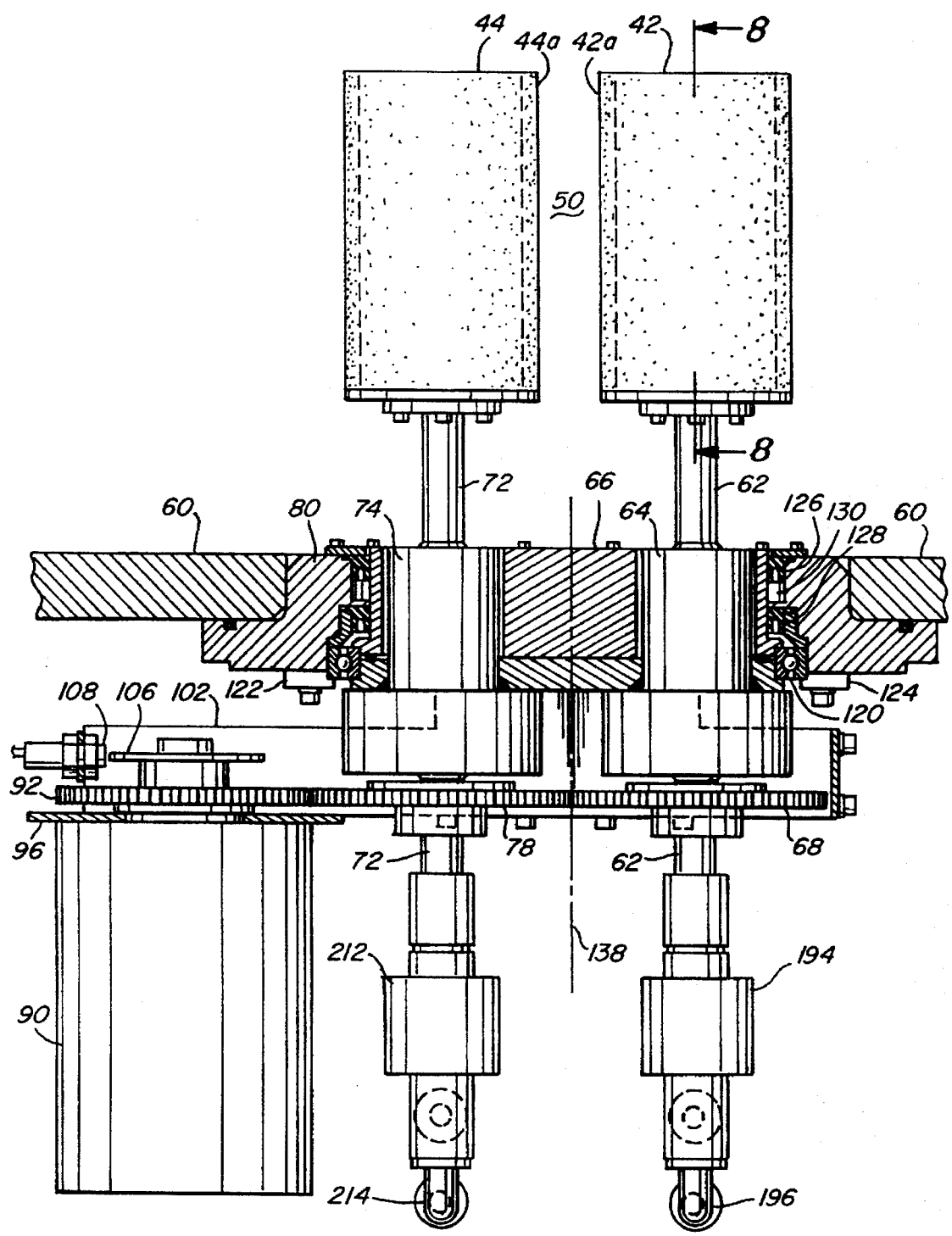
FIG. 6 is a cross-sectional side view of the mass resolving slit assembly, taken along the line 6—6 of FIG. 5.
Figure 7:
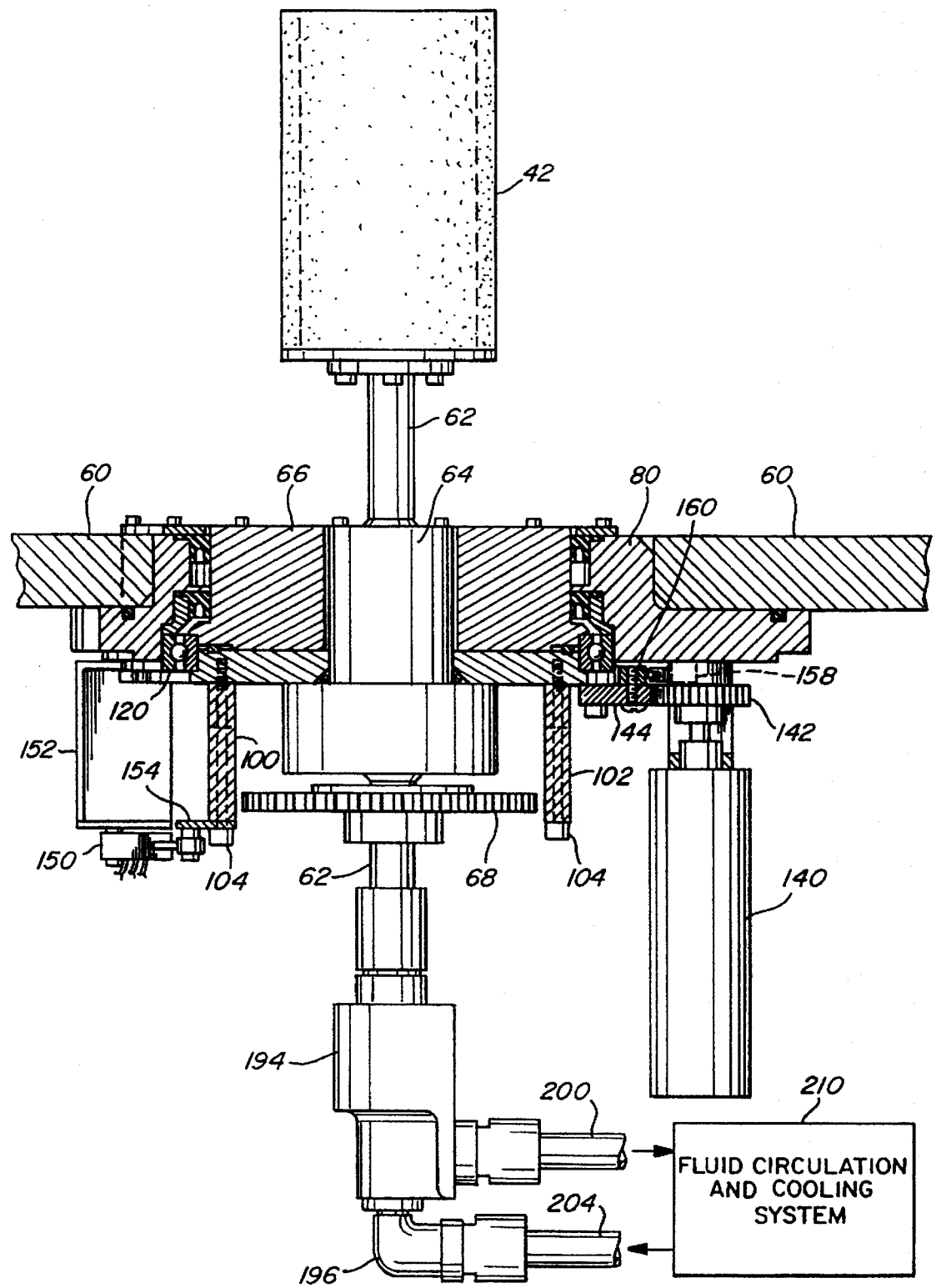
FIG. 7 is a cross-sectional end view of the mass resolving slit assembly, taken along the line 7—7 of FIG. 5.

As indicated above, the slit assembly of the present invention preferably includes a cooling system for actively cooling cylinders 42 and 44. As shown in FIGS. 6 and 7, shaft 62 extends below gear 68 and is provided with rotary fittings 194 and 196. Rotary fitting 194 provides a connection to outer tube 178 (FIG. 8) of shaft 62, and rotary fitting 196 provides a connection to inner tube 176 of shaft 62. The fittings 194 and 196 are connected by conduits 200 and 204, respectively, to a fluid circulation and cooling system 210, shown schematically in FIG. 7. The fluid circulation and cooling system 210 includes a pump for circulating a cooling fluid, typically water, through the cylinder 42 and a heat exchanger for cooling heated water returned from cylinder 42. Such fluid circulation and cooling systems are well known to those skilled in the art. The fluid circulation and cooling system 210 is connected by rotary fittings 212 and 214 (FIG. 6) to cylinder 44.

In operation, cooling fluid flows into cylinder 42 through conduit 204, fitting 196 and inner tube 176. The heated fluid returns from cylinder 42 through passage 186, outer tube 178, fitting 194 and conduit 200 to the fluid circulation and cooling system 210. Referring now to FIG. 8, the fluid enters the interior volume 174 of cylinder 42 through inner tube 176 and passes through the space between the top of cylindrical baffle 180 and top wall 182 of shell 170. The fluid then circulates through the cylindrical passage 184 between sidewall 171 and baffle 180, and is exhausted through outer tube 178. Thermal energy imparted to the outer sleeve 190 by the ion beam is conducted through sidewall 171 to the fluid in cylindrical passage 184, thus providing efficient thermal transfer.

In a preferred embodiment, each of the cylinders 42 and 44 has a diameter of about 3 inches and a length of about 5 inches. The graphite outer sleeve has a thickness of about ¼ inch and is preferably a high density graphite material. The shell 170 is preferably aluminum and has a thickness of about ¼ inch. In the preferred embodiment, the radial dimension of cylindrical passage 184 is about ¹⁄₁₀ inch.

Cooling water is circulated through each of the cylinders 42 at a rate of 1.2 gallons per minute. This configuration has provided highly satisfactory performance for ion beam currents up to 35 milliamps and powers over 3000 watts.

Figure 9:
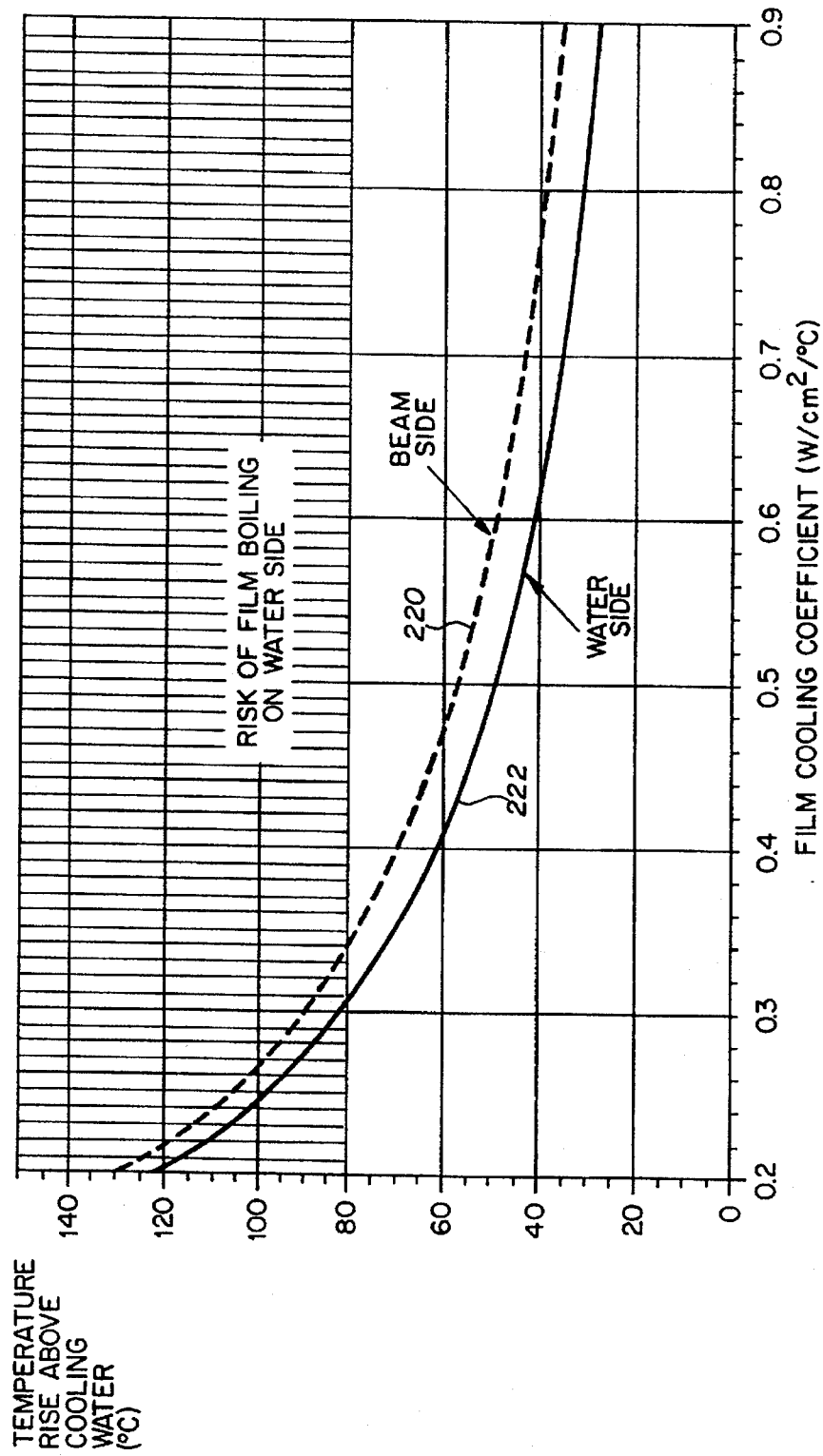
FIG. 9 is a graph of equilibrium rotating cylinder temperature rise as a function of film cooling coefficient.

The temperature rise of a cylinder above the temperature of the cooling water with the ion beam focused entirely on one cylinder is shown in FIG. 9 as a function of film cooling coefficient. While this does not represent normal operation, it is possible for the ion beam to be focused on one side of the slit during system setup. The thermal design must accommodate the situation. The plot of FIG. 9 shows the outside wall temperature (curve 220) and the inside wall temperature (curve 222) for an ion beam power of 2500 watts. This corresponds roughly to 30 milliamps of beam current at an extraction voltage of 80 Kv. As shown in FIG. 9, the outer wall averages about 8° C. hotter than the inner wall. If the inner wall temperature exceeds 100° C., film boiling can occur. Thus, it is preferred that the inner wall temperature remains below 100° C. Assuming a water starting temperature of 20° C. and allowing a 10° C. margin for bulk heating of the water, this means that the inner wall temperature should not rise above 70° C. From FIG. 9, this requires that the film cooling coefficient exceed 0.35 W/cm$^2$/°C.

The maximum single pass temperature rise for an aluminum cylinder, where the beam is steered fully onto to one cylinder, is shown in FIG. 10 as a function of distance into the aluminum from the surface, for different cylinder rotation speeds. As shown in FIG. 10, the single pass surface temperatures rise is very modest, especially at high rotation rates. At the end of the heating pulse, the heat has diffused less than halfway through the 0.64 cm thickness of the aluminum. As a consequence the peak heating shown in FIG. 10 is independent of the film cooling coefficient for the water cooling. More specifically, the cylinder temperature rise is a linear superposition of the quasi-steady state temperature rise and the transient rise.

If the rotation speed of cylinders 42 and 44 is sufficiently high, the heating that occurs is essentially uniform over the entire exposed surfaces of the cylinders. Thus, the temperature rise is much reduced. Sputtering also occurs over a large surface area, so that surface erosion is reduced. Because of the large tangent angle between the ion beam and the cylinder surface, the power density on the cylinder surface is reduced. In combination with the short exposure time provided by rotation, the surface temperature gradient is much reduced in comparison with conventional mass resolving slits. This helps to prevent fracture of the surface material along grain boundaries. With stationary slits of high density graphite, an effective erosion rate of 1500 to 2000 atoms per incident ion was measured. This far exceeds the sputtering coefficient of 3–10 (dependent on incident angle) and shows that the graphite erosion is dominated by thermal stress. With rotating cylinders fabricated of the same grade of graphite, the effective erosion rate was only 6 atoms per incident ion. Thus, erosion was reduced more than 250-fold. Moreover, the choice of materials is greatly increased because of the much lower temperature rise. To summarize, the advantages of the rotating cylinders include: (1) reduced erosion and maintenance due to a large effective surface area, (2) simple and effective water cooling, (3) reduced thermal stress which dramatically reduces particle production, and (4) a wider choice of materials for defining the slit.

The mass resolving slit assembly of the present invention has provided significantly improved performance over prior art mass slit configurations. For an ion implanter having an ion beam with a power density of about 3000 W/cm$^2$ at the mass resolving slit, the prior art fixed slit configuration has a life on the order of ten minutes. Under the same conditions, the mass resolving slit assembly of the present invention has a lifetime of over one year, indicating dramatically reduced sputtering and wafer contamination.

Numerous variations are included within the scope of the present invention. For example, a variety of different drive mechanisms may be utilized. Any drive mechanism capable of rotating cylinders 42 and 44 about their respective central axes may be utilized. The cylinders may be replaced with other slit-defining elements. Any slit-defining element capable of being rotated about its central axis may be utilized. The shapes of the slit-defining elements and their positions relative to each other determine the size and shape of the slit through which the ion beam passes. The slit assembly is not limited to use with ion beams. The slit assembly may be used for defining or spatially filtering any charged particle beam. It is not necessary that two cylinders be utilized. If desired, one side of the slit may be defined by a conventional fixed wall. In general, the invention involves the use of at least one rotating element for spatially filtering, i.e. partially blocking, a charged particle beam. Different techniques may be utilized for adjusting the width of the slit. For example, cylinders 42 and 44 may be moved toward or away from each other to adjust the width of the slit. The system for slit adjustment may be omitted entirely if a fixed width slit is acceptable. Furthermore, the cooling system may be omitted in applications where acceptable operating temperatures are achieved without the use of a cooling system. The beam-defining slit assembly of the present invention is not limited to use in ion implanters having the configuration shown in FIG. 2, but may be used in any ion implanter that requires a beam-defining slit and, more generally, in any charged particle beam system.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Charged particle beam apparatus comprising:
   a charged particle beam source for directing a charged particle beam along a beam path toward a target; and
   a slit assembly disposed along said beam path, said slit assembly comprising:
      first and second cylinders positioned on opposite sides of said beam path and spaced apart from each other, opposing surfaces of said first and second cylinders adjacent to said beam path defining a slit for passing at least a portion of said charged particle beam, said first and second cylinders having first and second central axes, respectively, and
      a drive system for rotating said first cylinder about said first central axis and for rotating said second cylinder about said second central axis.

2. Charged particle beam apparatus as defined in claim 1 wherein the slit defined by said first and second cylinders has a substantially constant width perpendicular to said beam path.

3. Charged particle beam apparatus as defined in claim 1 wherein the first and second central axes of said first and second cylinders are substantially parallel.

4. Charged particle beam apparatus as defined in claim 1 wherein the drive system for rotating said first and second cylinders includes means for rotating the opposing surfaces of said first and second cylinders adjacent to said beam path toward said charged particle beam source.

5. Charged particle beam apparatus as defined in claim 1 wherein the drive system for rotating said first and second cylinders comprises a motor and a coupler connected between said motor and said first and second cylinders.

6. Charged particle beam apparatus as defined in claim 5 wherein said coupler comprises a first gear connected to and driven by said motor, a second gear connected to said first cylinder and driven by said first gear, and a third gear connected to said second cylinder and driven by said second gear, wherein said first and second cylinders rotate in opposite directions when said motor is energized.

7. Charged particle beam apparatus as defined in claim 1 wherein said slit assembly further includes a cooling system for controlling the temperatures of said first and second cylinders.

8. Charged particle beam apparatus as defined in claim 7 wherein said first and second cylinders have internal passages and wherein said cooling system includes means for circulating a cooling fluid through the internal passages of said first and second cylinders.

9. Charged particle beam apparatus as defined in claim 8 wherein each of said first and second cylinders is coupled to said drive system by a drive shaft having coaxial passages for circulation of said cooling fluid.

10. Charged particle beam apparatus as defined in claim 7 wherein said first and second cylinders each comprise a cylindrical shell enclosing an interior volume and a cylindrical baffle positioned in said interior volume and concentric with said shell, said shell and said cylindrical baffle defining a cylindrical passage between them, and wherein said cooling system comprises means for circulating a cooling fluid through the cylindrical passage of each of said first and second cylinders.

11. Charged particle beam apparatus as defined in claim 1 wherein said first and second cylinders each comprise a cylindrical shell and a cylindrical graphite sleeve over said shell.

12. Charged particle beam apparatus as defined in claim 11 wherein said graphite sleeve is in thermal contact with said shell to provide low thermal conductivity between said graphite sleeve and said shell in vacuum.

13. Charged particle beam apparatus as defined in claim 1 wherein said drive system further includes means for adjusting a width of said slit perpendicular to said beam path.

14. Charged particle beam apparatus as defined in claim 13 wherein said means for adjusting the width of said slit comprises means for rotating said first and second cylinders with respect to an adjustment axis.

15. Charged particle beam apparatus as defined in claim 14 wherein said means for rotating said first and second cylinders with respect to said adjustment axis comprises a plate for supporting said first and second cylinders for rotation about said first and second central axes, a drive motor and a coupler connected between said drive motor and said plate, said plate being mounted for rotation about said adjustment axis when said drive motor is energized.

16. Charged particle beam apparatus as defined in claim 1 wherein said charged particle beam source comprises an ion source and said charged particle beam comprises an ion beam.

17. An ion implanter comprising:
an ion source for directing an ion beam along a beam path toward a workpiece;
a mass analyzing magnet disposed along said beam path for deflecting ions in said ion beam according to mass;
a mass resolving slit assembly disposed along said beam path downstream of said mass analyzing magnet for passing a selected ion species in said ion beam, said slit assembly comprising:
first and second cylinders positioned on opposite sides of said beam path and spaced apart from each other, opposing surfaces of said first and second cylinders adjacent to said beam path defining a slit for passing said selected ion species, said first and second cylinders having first and second central axes, respectively, and
a drive mechanism for rotating said first cylinder about said first central axis and for rotating said second cylinder about said second central axis;
an accelerator disposed along said beam path for accelerating the ions in said ion beam to desired energies;
means for distributing said ion beam over the workpiece; and
a vacuum system for maintaining a high vacuum along said beam path between said ion source and said workpiece.

18. An ion implanter as defined in claim 17 wherein the drive mechanism for rotating said first and second cylinders includes means for rotating the opposing surfaces of said first and second cylinders adjacent to said beam path toward said ion source.

19. An ion implanter as defined in claim 17 wherein said drive mechanism for rotating said first and second cylinders comprises a motor, a first gear connected to and driven by said motor, a second gear connected to said first cylinder and driven by said first gear, and a third gear connected to said second cylinder and driven by said second gear, wherein said first and second cylinders rotate in opposite directions when said motor is energized.

20. An ion implanter as defined in claim 17 wherein said mass resolving slit assembly further includes a cooling system for cooling said first and second cylinders.

21. An ion implanter as defined in claim 20 wherein said first and second cylinders have internal passages and wherein cooling system includes means for circulating a cooling fluid through the internal passages of said first and second cylinders.

22. An ion implanter as defined in claim 20 wherein each of said first and second cylinders is coupled to said drive mechanism by a drive shaft having coaxial passages for circulation of a cooling fluid, wherein said first and second cylinders each comprise a cylindrical shell enclosing an interior volume and a cylindrical baffle positioned in said interior volume and concentric with said shell, said shell and said cylindrical baffle defining a cylindrical passage between them, and wherein said cooling system comprises means for circulating said cooling fluid through the cylindrical passage of each of said first and second cylinders.

23. An ion implanter as defined in claim 17 wherein said first and second cylinders each comprise a cylindrical shell and a cylindrical graphite sleeve over said shell.

24. An ion implanter as defined in claim 17 wherein said drive mechanism further includes means for adjusting a width of said slit perpendicular to said beam path.

25. An ion implanter as defined in claim 24 wherein means for adjusting the width of said slit comprises means for rotating said first and second cylinders with respect to an adjustment axis.

26. A slit assembly for use in a charged particle beam system wherein a charged particle beam is directed along a beam path, said slit assembly comprising:
first and second cylinders spaced apart from each other, opposing surfaces of said first and second cylinders adjacent to said beam path defining a slit for passing said charged particle beam, said first and second cylinders having first and second central axes, respectively; and a drive system for rotating said first cylinder about said first central axis and for rotating said second cylinder about said second central axis.

27. A slit assembly as defined in claim 26 wherein the drive system includes means for rotating the opposing surfaces of said first and second cylinders adjacent to said beam path into said charged particle beam.

28. A slit assembly as defined in claim 26 further including a cooling system for cooling said first and second cylinders.

29. A slit assembly as defined in claim 28 wherein said first and second cylinders each comprise a cylindrical shell enclosing an interior volume and a cylindrical baffle positioned in said interior volume and concentric with said shell, said shell and said cylindrical baffle defining a cylindrical passage between them, and wherein said cooling system comprises means for circulating a cooling fluid through the cylindrical passage of each of said first and second cylinders.

30. A slit assembly as defined in claim 26 wherein said drive system further includes means for adjusting a width of said slit perpendicular to said beam path.

31. A method for spatial filtering of a charged particle beam directed along a beam path, said method comprising the steps of:

positioning first and second cylinders on opposite sides of said beam path, said first and second cylinders being spaced apart from each other such that opposing surfaces of said first and second cylinders adjacent to said beam path define a slit for passing at least a portion of said charged particle beam, said first and second cylinders having first and second central axes, respectively;

rotating said first cylinder about said first central axis; and rotating said second cylinder about said second central axis.

32. A method as defined in claim 31 wherein the steps of rotating said first and second cylinders include rotating said first cylinder and said second cylinder in opposite directions such that the opposing surfaces of said first and second cylinders adjacent to said beam path rotate toward a source of said charged particle beam.

33. A method as defined in claim 31 further including the step of circulating a cooling fluid through said first and second cylinders.

34. A method as defined in claim 31 further including the step of adjusting a width of said slit perpendicular to said beam path by rotating said first and second cylinders with respect to an adjustment axis.

35. Charged particle beam apparatus comprising:

a charged particle beam source for directing a charged particle beam along a beam path toward a target; and a beam-defining assembly disposed along said beam path, said beam-defining assembly comprising:

a beam-defining element positioned along said beam path such that a first portion of said charged particle beam is incident on said beam-defining element and a second portion of said charged particle beam passes said beam-defining element along said beam path toward said target, said beam-defining element having a central axis, and a drive system for continuously rotating said beam-defining element about said central axis such that different surface regions of said beam-defining element are exposed to said charged particle beam as said beam-defining element is rotated.

36. Changed particle beam apparatus as defined in claim 35 wherein said beam-defining element comprises a cylinder.

* * * * *